United States Patent
Bedell et al.

(10) Patent No.: US 9,205,631 B2
(45) Date of Patent: Dec. 8, 2015

(54) CONTROLLING THE MELT FRONT OF THIN FILM APPLICATIONS

(71) Applicant: INTERNATIONAL BUSINESS MACHINES CORPORATION, Armonk, NY (US)

(72) Inventors: Stephen W. Bedell, Wappingers Falls, NY (US); John A. Ott, Greenwood Lake, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 50 days.

(21) Appl. No.: 13/966,622

(22) Filed: Aug. 14, 2013

(65) Prior Publication Data

US 2015/0047781 A1 Feb. 19, 2015

(51) Int. Cl.
| | |
|---|---|
| *B29C 65/00* | (2006.01) |
| *B32B 37/00* | (2006.01) |
| *B32B 37/06* | (2006.01) |
| *B32B 37/04* | (2006.01) |
| *H01L 21/00* | (2006.01) |
| *B23K 3/04* | (2006.01) |

(Continued)

(52) U.S. Cl.
CPC ............. *B32B 37/003* (2013.01); *B23K 3/04* (2013.01); *B23K 37/00* (2013.01); *B23K 37/06* (2013.01); *B32B 37/04* (2013.01); *B32B 37/06* (2013.01); *H01L 21/00* (2013.01); *B32B 1/00* (2013.01); *B32B 9/041* (2013.01); *B32B 15/00* (2013.01); *B32B 37/10* (2013.01); *B32B 2457/14* (2013.01); *H01L 21/02* (2013.01); *H01L 21/02104* (2013.01); *H01L 21/02112* (2013.01); *H01L 21/02145* (2013.01); *H01L 21/02153* (2013.01); *H01L 21/02172* (2013.01); *H01L 21/02178* (2013.01); *H01L 21/02186* (2013.01); *H01L 21/02296* (2013.01); *H01L 21/02384* (2013.01)

(58) Field of Classification Search
CPC ... H01L 21/00; H01L 21/02; H01L 21/02104; H01L 21/02145; H01L 21/02112; H01L 21/02153; H01L 21/02172; H01L 21/02178; H01L 21/02186; H01L 21/02296; H01L 21/02384; B32B 1/00; B32B 9/041; B32B 15/00; B32B 37/10
USPC ........... 156/285, 286, 382; 136/243; 438/5, 6, 438/14, 54, 55
See application file for complete search history.

(56) References Cited

U.S. PATENT DOCUMENTS

| | | | | |
|---|---|---|---|---|
| 4,040,083 A | * | 8/1977 | Saiki et al. | 257/643 |
| 4,489,742 A | * | 12/1984 | Moore et al. | 136/203 |

(Continued)

FOREIGN PATENT DOCUMENTS

| | | |
|---|---|---|
| JP | 63080544 | 11/1988 |
| JP | 2008066646 | 3/2008 |
| JP | 2011235442 | 11/2011 |

OTHER PUBLICATIONS

Gosele, U., et al. "Semiconductor Wafer Bonding" Annual Review of Materials Science, vol. 28. Aug. 1998. pp. 215-241.

(Continued)

*Primary Examiner* — Michael N Orlando
*Assistant Examiner* — Matthew Hoover
(74) *Attorney, Agent, or Firm* — Tutunjian & Bitetto, P.C.

(57) ABSTRACT

Systems and methods for bonding include selectively heating an initial location of a sample to melt a bonding layer at an interface between a first layer and a second layer of the sample. The heating is propagated in a direction away from the initial location such that a melt front of the bonding layer is translated across the interface to provide a void free bond between the first layer and the second layer.

10 Claims, 7 Drawing Sheets

(51) Int. Cl.
 _B23K 37/00_ (2006.01)
 _B23K 37/06_ (2006.01)
 _H01L 21/02_ (2006.01)
 _B32B 9/04_ (2006.01)
 _B32B 37/10_ (2006.01)
 _B32B 15/00_ (2006.01)
 _B32B 1/00_ (2006.01)

(56) References Cited

U.S. PATENT DOCUMENTS 5,429,985 A * 7/1995 Sopori .......................... 438/658
5,700,987 A    12/1997 Basavanhally
5,951,893 A *  9/1999 Bitko et al. .................... 219/209
6,031,729 A    2/2000 Berkely et al.
6,423,939 B1   7/2002 Pan
6,893,885 B2   5/2005 Lemmerhirt et al.
6,911,624 B2   6/2005 Koopmans
2008/0064128 A1* 3/2008 Ishigaki ........................ 438/14
2010/0311250 A1 12/2010 Bedell et al.

OTHER PUBLICATIONS

Shahrjerdi, D., et al. "High-Efficiency Thin-Film InGaP/InGaAs/Ge Tandem Solar Cells Enabled by Controlled Spalling Technology" Applied Physics Letters, vol. 100, No. 5. Jan. 2012. (4 Pages).

* cited by examiner

700

```
┌─────────────────────────────────────────────────────────────┐
│  Providing a sample having a first layer and a second layer │
│                      on a heating array                     │
│                            702                              │
│                                                             │
│    ┌─────────────────────────────────────────────────┐      │
│    │  Controlling an environment of the sample       │      │
│    │            using a vacuum                       │      │
│    │                   704                           │      │
│    └─────────────────────────────────────────────────┘      │
│                                                             │
│    ┌─────────────────────────────────────────────────┐      │
│    │  Employing a membrane conformed over a surface  │      │
│    │  of the sample for improved thermal contact     │      │
│    │                   706                           │      │
│    └─────────────────────────────────────────────────┘      │
└─────────────────────────────────────────────────────────────┘
                              │
                              ▼
┌─────────────────────────────────────────────────────────────┐
│  Selectively heating an initial location of the sample to   │
│  melt a bonding layer at an interface between the first     │
│               layer and the second layer                    │
│                           708                               │
└─────────────────────────────────────────────────────────────┘
                              │
                              ▼
┌─────────────────────────────────────────────────────────────┐
│  Propagating the heating in a direction away from the       │
│  initial location such that a melt front of the bonding     │
│  layer is translated across the interface to provide a      │
│  void free bond between the first layer and the second      │
│                          layer                              │
│                           710                               │
│                                                             │
│    ┌─────────────────────────────────────────────────┐      │
│    │  Wherein the direction includes at least one of │      │
│    │       side to side and center to edge           │      │
│    │                   712                           │      │
│    └─────────────────────────────────────────────────┘      │
└─────────────────────────────────────────────────────────────┘
```

FIG. 7

CONTROLLING THE MELT FRONT OF THIN FILM APPLICATIONS

BACKGROUND

1. Technical Field

The present invention relates to thin film technology, and more particularly to controlling the melt front of thin film applications.

2. Description of the Related Art

Heterogeneous material integration has become an important enabling technology for a wide range of commercial and military applications. Examples include silicon-on-insulator (SOI) technology for complementary metal-oxide semiconductor (CMOS) integrated circuits (ICs). Advances in wafer bonding are cornerstone to emergence of these new heterogeneous substrates; it allows one type of material to be combined with another type of material for which growth or deposition options do not exist.

There are currently a limited number of wafer-scale bonding methods. One such method is semiconductor wafer bonding which relies on atomic-scale bonding of flat, mirror-polished glass or semiconductor surfaces. Many of the other bonding techniques such as anodic, thermocompression, epoxy, eutectic or solder-based bonding are most often performed at the chip, package or die level. It is, in general, difficult to achieve large area void-free bonding using methods that employ a bonding agent (intervening materials such as metallics or polymers). Moreover, large-area bonding of thin, strained, brittle films with potentially high curvature onto arbitrary rigid substrates is non-existent.

Efforts to (i) create thin-film substrates from bulk materials (i.e., semiconductors) and (ii) form thin-film device layers by removing device layers from the underlying bulk substrates on which they were formed are ongoing. For example, epoxy has been used to bond a III-V based solar cell structure to a silicon handle wafer. However, the epoxy method does not allow higher temperature excursions without degradation of bonding material. In addition, filled epoxies limit the thermal conductivity for some applications. Moreover, conventional wafer bonding is usually performed between two rigid wafers, and all available tooling is specifically designed for this situation. One of the major problems associated with bonding thin, curved, and potentially rough layers is that there is a larger density of trapped air or voids at the interface compared to bonding rigid, polished wafers.

SUMMARY

A method for bonding includes selectively heating an initial location of a sample to melt a bonding layer at an interface between a first layer and a second layer of the sample. The heating is propagated in a direction away from the initial location such that a melt front of the bonding layer is translated across the interface to provide a void free bond between the first layer and the second layer.

A system for bonding includes a plurality of heating elements. A controller is configured to control the plurality of heating elements to selectively heat an initial location of a sample to melt a bonding layer at an interface between a first layer and a second layer of the sample, and propagate the heating in a direction away from the initial location such that a melt front of the bonding layer is translated across the interface to provide a void free bond between the first layer and the second layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 7 is a block/flow diagram showing a system/method for controlling a melt front, in accordance with one illustrative embodiment.

DETAILED DESCRIPTION OF PREFERRED EMBODIMENTS

Figure 1:
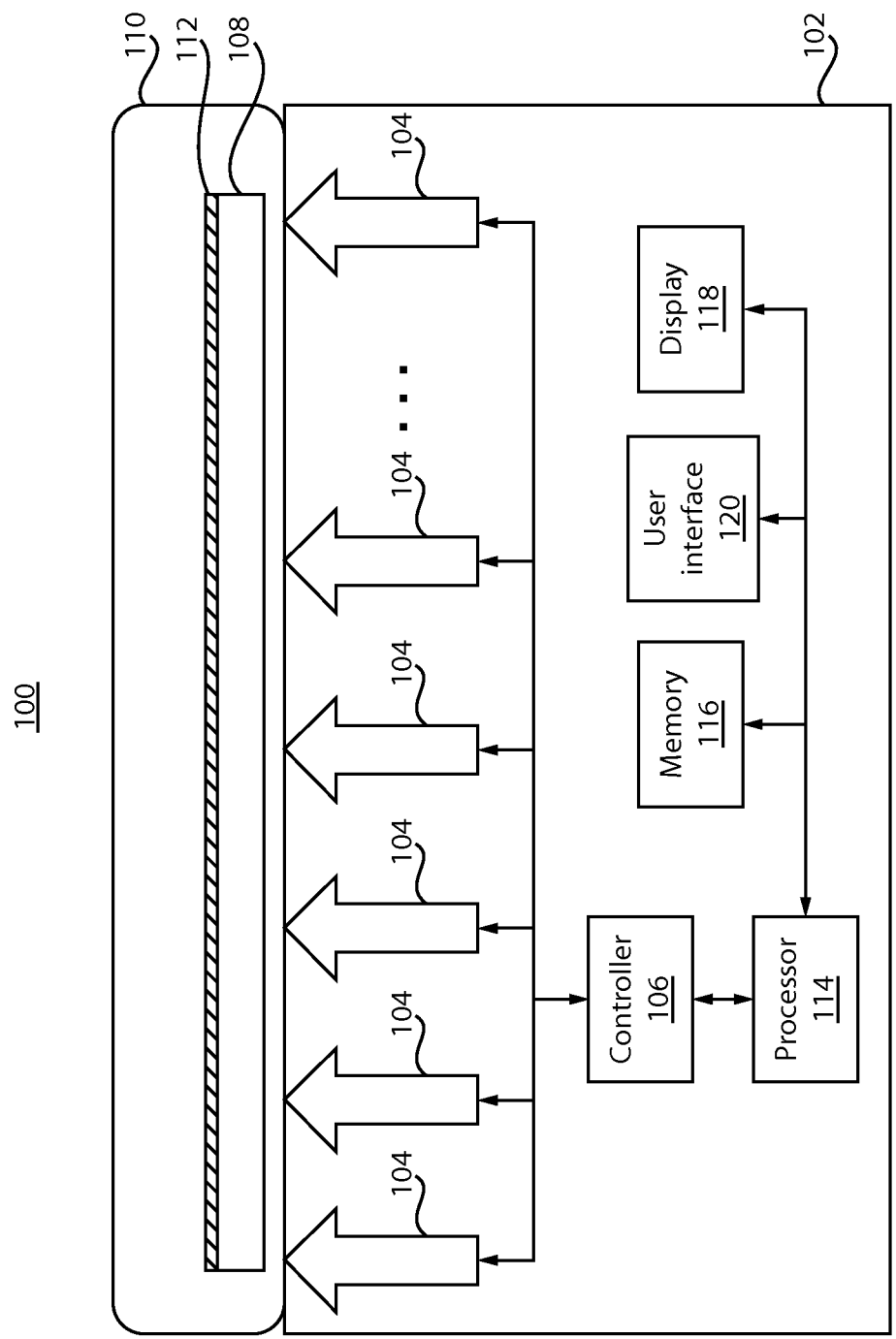
FIG. 1 is a block/flow diagram showing a programmable heater system, in accordance with one illustrative embodiment.

In accordance with the present principles, systems and methods for controlling the melt front of thin film applications are provided. The present invention bonds thin, curved, and strained film layers to a carrier substrate, which is typically rigid. The thin film assembly and carrier substrate are placed in contact with pre-metallized bonding surfaces and heated locally to induce bonding at a specified location. The bond occurs when the temperature is raised above the melting/reflow temperature of the bonding materials used. The heat is then propagated away from the initial bond site, translating (i.e., transferring) the melt front accordingly. The melt front is directionally (e.g., left to right, radially out, etc.) moved across the interface of the thin film and carrier substrate to provide for a void free bonded interface.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a block/flow diagram showing a programmable heater system 100 is illustratively depicted in accordance with one embodiment. The programmable heater system 100 provides metal bonding with superior temperature stability and better thermal contact than conventional approaches. The system 100 allows the control of the melt front to provide for a void free attachment or bond between, e.g., a carrier substrate and thin film.

The programmable heater system 100 includes an array 102 including heating elements 104 which are controlled by a controller 106. The heating elements 104 may include n separate heating elements which may be individually controlled by the controller 106. Preferably, the controller 106 controls the heating elements 104 to locally heat the sample 108 at specific locations to induce bonding. The heat is then directionally propagated away from the initial bonding site to move the melt front throughout the sample 108, providing for a void free bonding. Array 102 may also include temperature measuring elements (not shown) which are monitored and optionally displayed to provide real-time temperature distribution information. The temperature measuring elements may feedback temperature distribution information to the controller 106. In this manner, the controller 106 may control the heating elements 104 to account for the temperature distribution information. The temperature measuring elements may include, e.g., thermocouples, semiconductors (bandgap temperature sensors), optical pyrometers or combinations thereof.

The controller 106 preferably includes a proportional-integral-derivative (PID) controller, however other controllers may also be employed. The controller 106 may include or employ one or more processors 114 and memory 116 for storing data. The controller 106 may also employ one or more displays 118 for viewing and/or interacting with the controller 106. This may be further facilitated by a user interface 120.

The array 102 heats a sample 108, such as, e.g., a semiconductor wafer or chip. The sample 108 includes two portions or layers which are to be bonded, such as, e.g., a thin film and carrier substrate. Other samples may also be employed in the context of the present invention. Preferably, the thin film and carrier substrate of the sample 108 are bonded by a bonding layer having a melting or reflow temperature. The array 102 directionally controls heater elements 104 to allow the bonding layer in the sample 108 to locally melt and remain liquid so that complete contact with metals can be realized by propagation of the melt front.

The sample 108 may be encompassed within a chamber or vessel 110 to allow control of the ambient surroundings of the sample 108. The vessel 110 may include a vacuum or other controlled atmosphere. In one embodiment, gases may be introduced in the vessel 110 and oxidation and/or reaction rates may be controlled. For example, a gas-phase flux may be introduced in the vessel 110 for solder applications, as fluxes tend to eliminate surface oxides. Gases introduced in vessel 110 may include, e.g., gas-phase acids (e.g., $H_2SO_4$, HCl, $HNO_3$, $H_3PO_4$, etc.), ionized gaseous species (e.g., $H_2$), etc. The ionized species could be formed by remote plasma or other ionizing methods. Multiple gases may be introduced to form various fluxing compounds such as $NH_3+HCl \rightarrow NH_4Cl$ (ammonium chloride). The fluxing of the surfaces would lead to improved wetting/bonding for materials that are easily oxidized, such as, e.g., indium, reactive solders (e.g., s-bond), etc.

In another embodiment, a membrane or diaphragm 112 may be optionally placed over the sample 108 (e.g., as a sheet). The diaphragm 112 is preferably pliable to allow uniform pressure to be exerted over the (potentially non-planar) sample 108. The uniform pressure from diaphragm 112 provides for improved thermal contact between sample 108 and array 102 and thus improved control of localized heating. The diaphragm 112, if present, can be comprised of any material with low modulus of elasticity (<4 GPa) and capable of withstanding high temperatures (~300° C.). Exemplary materials include, but are not limited to, polyimides, silicones, and flouropolymers.

Figure 2:
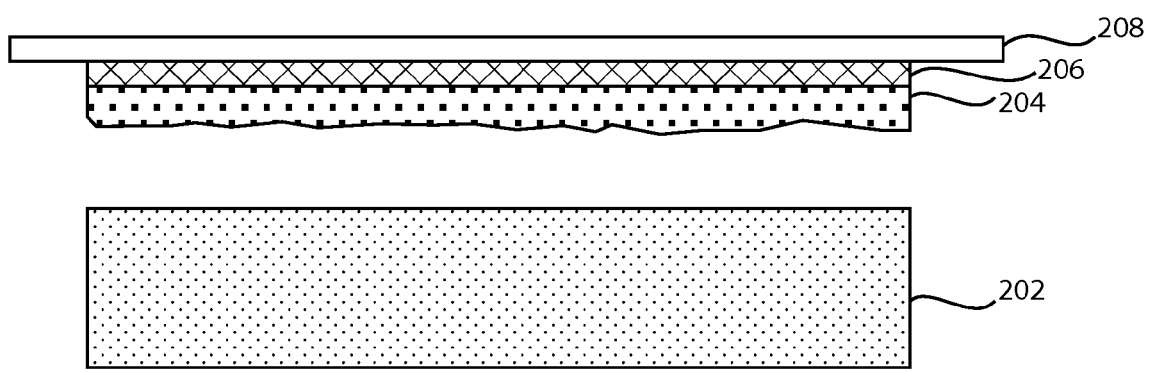
FIG. 2 is a detailed view of the sample having a carrier substrate to be bonded with a thin film, in accordance with one illustrative embodiment.

Referring now to FIG. 2, the sample 108 in the programmable heater system 100 is shown in more detail, in accordance with one illustrative embodiment. The programmable heater system 100 bonds the layer 204 with the layer 202 of the sample 108. The layer 204 preferably includes a thin film and the layer 202 preferably includes a carrier substrate. However, it should be understood that the layers 202 and 204 may include a layer or structure of any size or thickness in accordance with the present principles. The carrier substrate 202 may include a semiconductor substrate or any other suitable substrate. The thin film 204 is preferably a spalled semiconductor sample, such as, e.g., a III-V photovoltaic spalled sample, etc. Thin film 204 and/or carrier substrate 202 may contain partially or completely finished devices including transistors, p-n junctions, inductors, capacitors, conductors, or optoelectronic devices. The thin film 204 and carrier substrate 202 are typically rigid and/or curved so as to result in voids after bonding using convention techniques.

The thin film 204 may optionally be stressed by stress layer 206, which may include one or more metals, e.g., iron (Fe), nickel (Ni), titanium (Ti), molybdenum (Mo), etc. A handling layer 208 may be provided over the stress layer 206 for handling the thin film 204. The handling layer 208 may include, e.g., tape, foil, or any other suitable materials.

Figure 3:
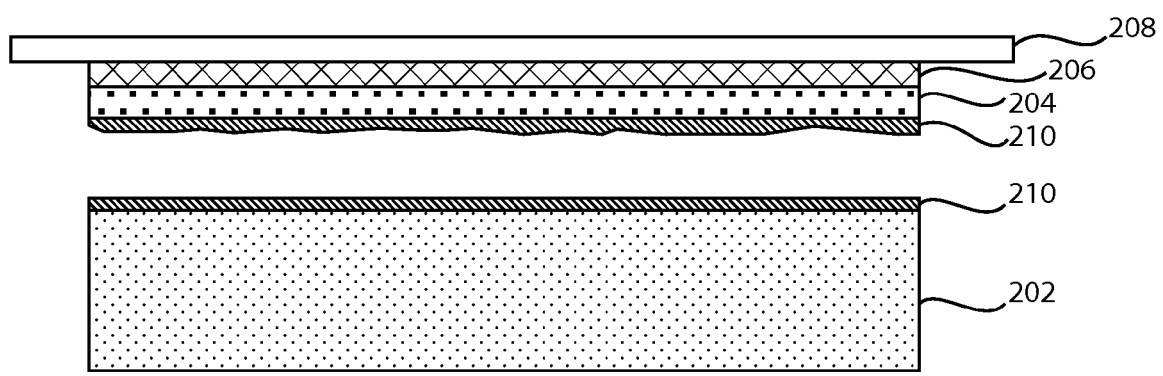
FIG. 3 is a sample having a bonding layer formed on the surface of the carrier substrate and thin film, in accordance with one illustrative embodiment.

Referring now to FIG. 3, a bonding layer 210 is applied on the thin film 204 and the substrate 202. The bonding layer 210 preferably includes a bonding metal having a melting or reflow temperature, such as, e.g., solders, multilayer metallization, transient liquid phase metallic layers, reactive solders, eutectic bonding metals, noble metals (thermocompression bonding), etc. Exemplary materials of the bonding layer 210 may include gold (Au), silver (Ag), platinum (Pt), palladium (Pd), indium (In), tin (Sn), nickel (Ni), tungsten (W), titanium (Ti), aluminum (Al), or other suitable materials or combinations of materials.

Figure 4:
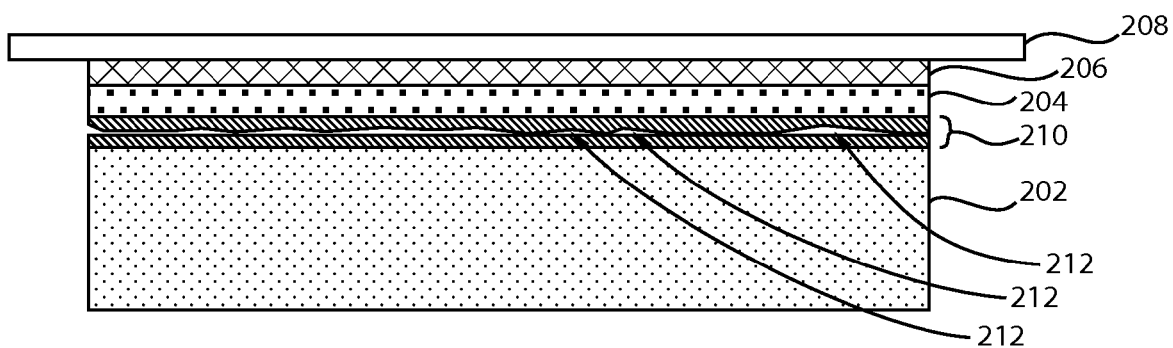
FIG. 4 is a sample having the carrier substrate in contact with the thin film, in accordance with one illustrative embodiment.

Referring now to FIG. 4, the thin film 204 and the substrate 202 of the sample 108 are placed in contact with each other. A uniform bonding force is then applied to the surface of sample 108 or, if present, diaphragm 112 to ensure intimate contact during the subsequent heating step. The bonding force is typically from 5 kilopascals (kPa) to 5 megapascals (5 MPa), with 100 kPa to 2 MPa being typical.

The sample 128 is then placed in the vessel 110 (FIG. 1), which may include a vacuum or other controlled atmosphere. In another embodiment, the thin film 204 and the substrate 202 of the sample 108 are placed in contact with each other after being placed in the vessel 110, which may include a vacuum or other controlled atmosphere. When placed in contact with each other, the thin film 204 and the substrate 202 of the sample 108 may include potential trapped air or void sites 212.

Figure 5:
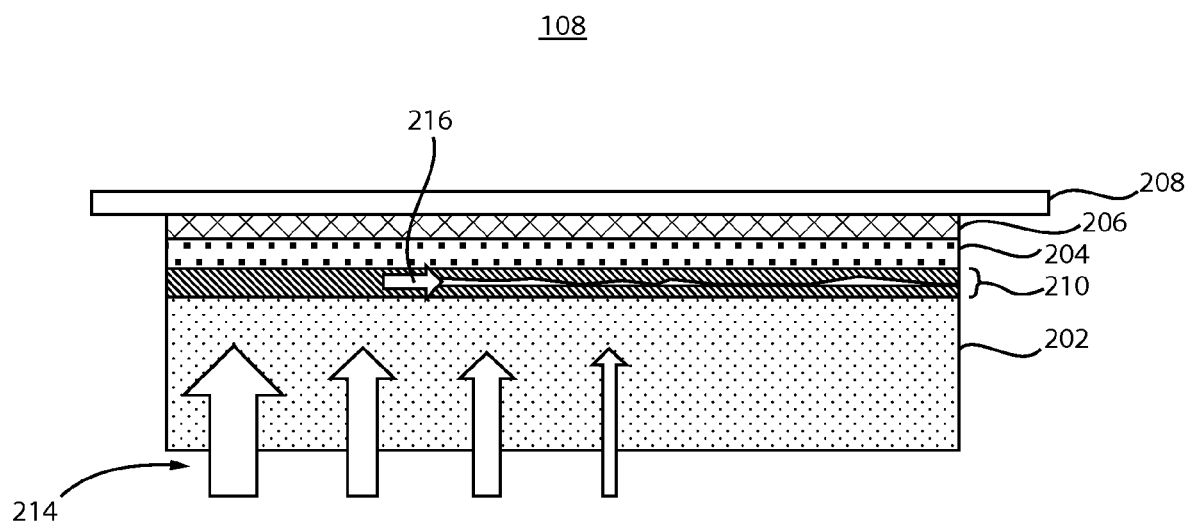
FIG. 5 is a sample having a melt front propagated across the sample to bond the carrier substrate and thin film, in accordance with one illustrative embodiment.

Referring now to FIG. 5, the sample 108 is bonded in a programmable heater system 100. The bonding between the thin film 204 and the substrate 202 (with bonding layer 210) is controlled by controller 106 (FIG. 1) to locally heat to induce bonding in a singular pre-specified location, forming a melt front 216. A melt front is a forward edge of a melt of the bonding layer 210 advancing from an initial position. Bonding occurs when the temperature is raised above the melting/reflow temperature of the bonding metallization used. The heat gradient or propagation 214 directs the heating away from the initial location due to the controller 106, moving the melt front 216 through the sample 128 accordingly. In other embodiments, heating may be directionally applied and maintained as the melt front advances across the sample 108. The present principles allow for a void free bonded interface between a thin film 204 and a carrier substrate 202.

In another embodiment, the temperature of the sample 108 is first raised uniformly to an initial temperature (soak temperature) that is below the desired bonding temperature. Subsequently, a heat gradient or propagation 214 is superimposed on the uniform initial temperature to form the melt front 216. The smaller gradient 214 allows for faster melt front 216 formation and propagation. This approach is particularly advantageous when bonding layer 210 comprises a transient liquid-phase (TLP) bonding metallurgy. In TLP bonding, melting of the bonding layer 210 only lasts for a finite time due to diffusion-mediated alloying. Therefore, the melt front must be made to transit the entire interface before solidification occurs.

Figure 6A:
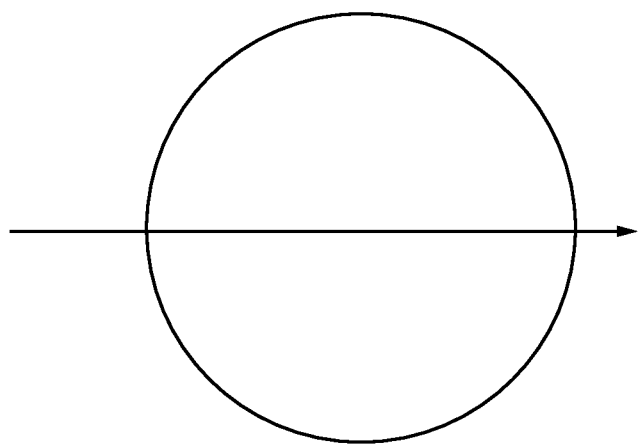
FIG. 6A is a top-down view of a sample having heat propagated from left to right, in accordance with one illustrative embodiment.
Figure 6B:
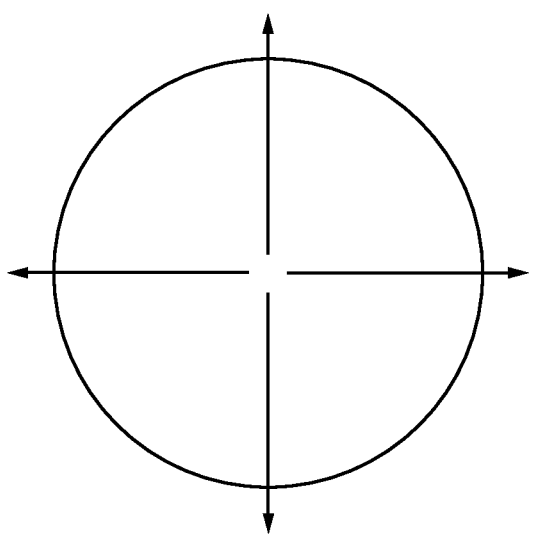
FIG. 6B is a top-down view of a sample having heat propagated radially out from the center of the sample to the edge, in accordance with one illustrative embodiment.

Referring now to FIGS. 6A and 6B, with continued reference to FIG. 1, a top-down view of the sample 108 is depicted to show heating propagation geometries, in accordance with one illustrative embodiment. In FIG. 2A, heating elements 104 are controlled by controller 106 to provide a heat propagation direction from left to right on the sample 108. In FIG. 2B, heating elements 104 are controlled by controller 106 to provide a heat propagation direction radially out from the center of the sample 108 to the edges. Other directions may be employed by the array 102 within the context of the present invention, such as, e.g., right to left, top to bottom, radially inwards, etc. The direction of the heat propagation translates the melt front through the sample 108 accordingly. The direction of heat propagation may be selected in accordance with a shape and/or size of the sample 108. For example, heating geometry may be radial outwards for a semiconductor wafer sample 108, or may be left to right for more complex shapes. Advantageously, the array 102 allows precise control of the melt front on the sample 108 to provide a void free bonded interface Referring now to FIG. 7, a block/flow diagram showing a method 700 for controlling the melt front is illustratively depicted in accordance with one embodiment. In block 702, a sample having a first layer and a second layer is provided on a heating array. Preferably, the first layer includes a thin film and the second layer includes a carrier substrate. The heating array includes a plurality of heating elements to bond the first layer and the second layer. In block 704, an environment of the sample is controlled using a vacuum. Gases may be introduced in the vacuum to prepare the surfaces for bonding. In block 706, a membrane or diaphragm may be placed over the sample (e.g., as a sheet) to allow uniform pressure to be exerted on the sample for improved thermal contact.

In block 708, an initial location of the sample is selectively heated to melt a bonding layer between the first layer and the second layer. The bonding layer preferably includes a bonding metallization layer having a melting/reflow temperature. In block 710, the heating is propagated in a direction away from the initial location such that a melt front of the bonding layer is translated across the interface to provide a void free bond between the first layer and the second layer. A melt front is a forward edge of a melt of the bonding layer advancing from an initial position. A controller (e.g., PID controller) may be employed to individually control heating elements of the heating array to propagate the heating. In one embodiment, heating elements may apply heat to the initial location, which is then removed and applied to a second location to propagate the heating. In other embodiments, heating elements may apply and maintain heat as the heating is propagated to the second location. In block 712, the direction includes at least one of side to side (e.g., left to right, top to bottom, etc.) and center to edge (e.g., radially out, radially in, etc.). The direction may be chosen based on a shape and/or a size of the sample.

Having described preferred embodiments of a system and method for controlling the melt front of thin film application (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for bonding, comprising:
   selectively heating an initial location of a sample to melt a bonding layer at an interface between a first layer and a second layer of the sample; and
   removing voids in the bonding layer by propagating the heating in a single direction away from the initial location such that a melt front of the bonding layer is translated across the interface to provide a void free bond between the first layer and the second layer.

2. The method as recited in claim 1, further comprising controlling an environment of the sample using a vacuum.

3. The method as recited in claim 2, further comprising introducing a gas in the vacuum to alter the surface of the bonding layers.

4. The method as recited in claim 1, further comprising employing a membrane conformed over a surface of the sample for improved thermal contact.

5. The method as recited in claim 1, wherein the direction is selected based on at least one of a shape and size of the sample.

6. The method as recited in claim 1, wherein propagating the heating includes controlling the heating in accordance with temperature feedback information.

7. The method as recited in claim 1, wherein the direction includes at least one of side to side and center to edge.

8. The method as recited in claim 1, wherein the first layer includes a thin film and the second layer includes a substrate.

9. The method as recited in claim 1, wherein the bonding layer includes a bonding metallization layer.

10. The method as recited in claim 1, wherein the bonding layer has a composition selected from the group consisting of gold (Au), silver (Ag), platinum (Pt), palladium (Pd), indium (In), tin (Sn), nickel (Ni), tungsten (W), aluminum (Al) and a combination thereof.

* * * * *